(12) United States Patent
Tsai et al.

(10) Patent No.: US 9,331,030 B1
(45) Date of Patent: May 3, 2016

(54) INTEGRATED ANTENNA PACKAGE AND MANUFACTURING METHOD THEREOF

(71) Applicant: Industrial Technology Research Institute, Hsinchu (TW)

(72) Inventors: Cheng-Hua Tsai, New Taipei (TW); Shyh-Jong Chung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/569,799

(22) Filed: Dec. 15, 2014

(51) Int. Cl.
*H01L 23/66* (2006.01)
*H01L 21/768* (2006.01)
*H01L 23/522* (2006.01)
*H01L 23/532* (2006.01)

(52) U.S. Cl.
CPC .......... *H01L 23/66* (2013.01); *H01L 21/76802* (2013.01); *H01L 21/76877* (2013.01); *H01L 23/5226* (2013.01); *H01L 23/53228* (2013.01)

(58) Field of Classification Search
CPC .............. H01L 21/02672; H01L 21/2007; H01L 21/28079; H01L 21/56; H01L 21/4825; H01L 21/76205; H01L 21/76889; H01L 23/3114; H01L 23/4951; H01L 23/14; H01L 23/488; H01L 23/4952; H01L 23/3157; H01L 23/53233; H01L 23/53219; H01L 24/85; H01L 27/0814; H01L 29/6603; H01L 51/5296; H01L 41/1132
USPC ......... 438/241, 142, 135, 242, 270, 308, 455, 438/643, 487, 655, 768, 686, 687, 688, 612, 438/613, 700; 257/233, 277, E21.006, 257/E21.53, E21.126, E21.127, E21.134, 257/E21.165, E21.172, E21.215, E21.296, 257/E21.327, E21.347, E21.352, E21.366, 257/E21.438, E21.485, E21.499, E21.502, 257/E21.509
See application file for complete search history.

(56) References Cited

U.S. PATENT DOCUMENTS

| | | | | |
|---|---|---|---|---|
| 7,613,009 B2 * | 11/2009 | Young | ..................... | H01L 23/66 361/782 |
| 7,830,312 B2 | 11/2010 | Choudhury et al. | | |
| 7,852,281 B2 | 12/2010 | Choudhury | | |
| 8,269,671 B2 * | 9/2012 | Chen | ....................... | H01L 23/04 343/700 MS |
| 8,502,735 B1 * | 8/2013 | Moosbrugger | .......... | H01Q 3/30 343/700 MS |
| 8,988,299 B2 * | 3/2015 | Kam | .................... | H01Q 1/2283 343/767 |

(Continued)

OTHER PUBLICATIONS

Talebbeydokhti et al., "Low Cost BT Organic Material for Wireless 60 GHz Application," 2013 Electronic Components & Technology Conference, May 28-31, 2013, pp. 1634-1639.

(Continued)

*Primary Examiner* — David Nhu
(74) *Attorney, Agent, or Firm* — Jianq Chyun IP Office

(57) ABSTRACT

An integrated antenna package including a laminated structure and a multi-layered substrate is provided. The laminated structure includes at least a chip embedded therein and at least a plated through-hole structure penetrating the laminated structure. The multi-layered substrate is stacked on the laminated structure. The multi-layered substrate includes at least a metal layer located on one side of the multi-layered substrate away from the laminated structure and the metal layer includes at least an antenna pattern located above the chip. The multi-layered substrate includes at least a plated via and through-hole structure penetrating the multi-layered substrate and electrically connected to the chip, so that the antenna pattern is electrically connect with the chip. Also, the manufacturing method of the integrated antenna package is provided.

19 Claims, 4 Drawing Sheets

(56) References Cited

U.S. PATENT DOCUMENTS

2007/0217175 A1    9/2007    Young et al.
2010/0164783 A1    7/2010    Choudhury et al.

OTHER PUBLICATIONS

Liu et al., "Packages With Integrated 60-GHz Aperture-Coupled Patch Antennas," IEEE Transactions on Antennas and Propagation, Oct. 2011, pp. 3607-3616.

Gu et al, "Enhanced Multilayer Organic Packages with Embedded Phased-Array Antennas for 60-GHz Wireless Communications," 2013 Electronic Components & Technology Conference, May 28-31, 2013, pp. 1650-1655.

Hoivik et al., "High-efficiency 60 GHZ antenna fabricated using low-cost silicon micromachining techniques," 2007 IEEE Antennas and Propagation Society International Symposium, Jun. 9-15, 2007, pp. 5043-5046.

Kam et al., "Low-Cost Antenna-in-Package Solutions for 60-GHz Phased-Array Systems," 2010 IEEE 19th Conference on Electrical Performance of Electronic Packaging and Systems (EPEPS), Oct. 25-27, 2010, pp. 93-96.

Sun et al., "A Ball Grid Array Package With a Microstrip Grid Array Antenna for a Single-Chip 60-GHz Receiver," IEEE Transactions on Antennas and Propagation, Jun. 2011, pp. 2134-2140.

Balankutty et al., "A 12-Element 60GHz CMOS Phased Array Transmitter on LTCC Package with Integrated Antennas," 2011 IEEE Asian Solid State Circuits Conference (A-SSCC), Nov. 14-16, 2011, pp. 273-276.

Enayati et al., "Millimeter-Wave Horn-Type Antenna-in-Package Solution Fabricated in a Teflon-Based Multilayer PCB Technology," IEEE Transactions on Antennas and Propagation, Apr. 2013, pp. 1581-1590.

Khan et al, "Packaging a W-Band Integrated Module With an Optimized Flip-Chip Interconnect on an Organic Substrate," IEEE Transactions on Microwave Theory and Techniques, Jan. 2014, pp. 64-72.

Biglarbegian et al., "Integrated Microstrip-Fed Slot Array Antenna for Emerging Wireless Application in IPD Technology," 2011 IEEE MTT-S International Microwave Workshop Series on Millimeter Wave Integration Technologies, Sep. 15-16, 2011, pp. 41-44.

\* cited by examiner

INTEGRATED ANTENNA PACKAGE AND MANUFACTURING METHOD THEREOF

TECHNICAL FIELD

1. Field of the Invention

The present disclosure generally relates to a package structure and a manufacturing method thereof, and particularly relates to an integrated antenna package and the manufacturing method thereof.

2. Description of Related Art

Ever since the application of wireless receivers recently becomes the focus in the Consumer Electronics Show, it declares the coming of Wireless Gigabit Alliance (WiGi) and wireless high-definition (HD) standard applications. Although many manufacturers have developed chips of the millimeter-wave band (radio-frequency chips), there is no comprehensive solution regarding the package for the chips of the millimeter-wave band.

Traditional wire-bonding packages are not suitable for packaging radio frequency (RF) chips. However, for the low temperature co-fired ceramic (LTCC) and flip-chip packages, because of the substrate shrinkage caused by the process conditions and low process efficiency as well as very small pad sizes and pitches for the chips to be packaged, the yield of the package is unsatisfactory. It is advantageous to develop an integrated package of the antenna and RF chip(s).

SUMMARY

The present disclosure provides an integrated antenna package structure incorporating the radio frequency chip(s) and the antenna pattern(s). As the antenna pattern is arranged above or below the chip, the vertical arrangement helps to integrate the chip and the antenna pattern through vertical connection structure(s). By arranging the position of the antenna pattern vertically aligned with the position of the chip, the electrical connection structures electrically connect the RF chip(s) with the antenna pattern(s) located at different layers of the package structure, which shortens the signal transmission path and reduces the signal transmission loss.

The embodiment of the present disclosure provides a method for manufacturing an integrated antenna package. After providing a first metal layer, a chip is disposed on the first metal layer. The chip includes a first contact pad and a second contact pad, wherein the first contact pad and the second contact pad faces the first metal layer, and the first contact pad and the second contact pads are electrically connected with the first metal layer. A multilayer board is press laminated over the first metal layer and the chip. The multilayer board comprises a filling layer and a second metal layer, and the second metal layer is disposed on the filling layer and electrically connected to the first metal layer and the chip is embedded within the filling layer. After patterning the first metal layer, a multi-layered substrate is disposed to cover the patterned first metal layer, and one side of the multi-layered substrate away from the first patterned metal layer has a third metal layer. A through-hole is formed penetrating the multi-layered substrate and terminating at the patterned first metal layer electrically connected to the first contact pad. A plated via structure is then formed in the through-hole and the plated via structure connects the third metal layer and the first contact pad. The second metal layer and the third metal layer are patterned to form a patterned second metal layer and a patterned third metal layer, and the patterned third metal layer includes an antenna pattern located beneath the chip. The antenna pattern is electrically coupled to the chip through the plated via structure.

The embodiment of the present disclosure provides an integrated antenna package structure comprising a laminated structure and a multi-layered substrate. The laminated structure comprises a first metal layer, a second metal layer, a filling layer between the first metal layer and the second metal layer and at least one chip. The at least one chip is embedded within the filling layer, and the chip has a first contact pad and a second contact pad. The first metal layer and the first and second contact pads and the second metal layer are electrically connected. The multi-layered substrate is stacked on the laminated structure and covers over the first metal layer. The multi-layered substrate at least includes an insulating layer and a third metal layer, the third metal layer is located on one side of the multi-layered substrate away from the laminated structure and the metal layer includes at least an antenna pattern located below the chip. The multi-layered substrate includes at least a plated via structure penetrating through the multi-layered substrate and connected with the first contact pad, so as to electrically connect the antenna pattern with the chip.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION

FIGS. 1 to 6 show schematic cross-sectional views of process steps of a method for forming an integrated antenna package in accordance with an embodiment of the present disclosure.

Figure 1:
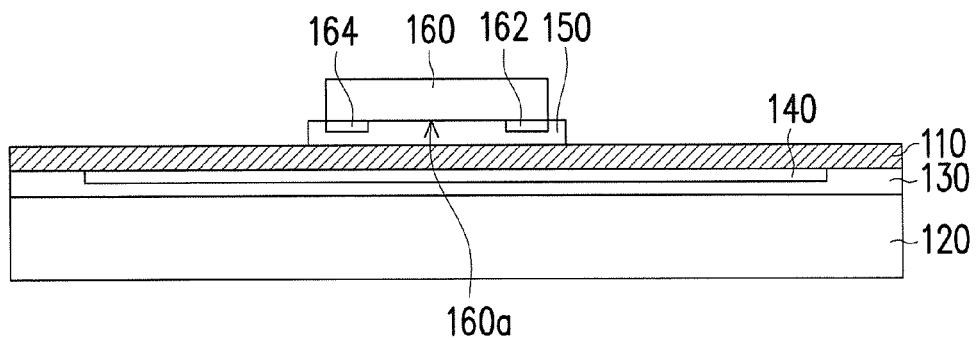
FIGS. 1 to 6 show schematic cross-sectional views of process steps of a method for forming an integrated antenna package in accordance with an embodiment of the present disclosure.

Referring to FIG. 1, a carrier plate 120 is provided. Next, a first metal layer 110 is attached to the carrier plate 120 by lamination, and the first metal layer 110 is attached to the carrier plate 120 through an adhesive layer 130. The bonding surface of the first metal layer 110 may have a release layer 140, and the release layer 140 only partially covers the bonding surface, so that the first metal layer 110 is partially bonded to the carrier plate 120 through the release layer 140 and the adhesive layer 130.

Referring to FIG. 1, an underfill 150 is then formed on the first metal layer 110. The chip 160 is disposed on the underfill 150, and the chip 160 is attached to the first metal layer 110 through the underfill 150. The chip 160 has an active surface 160a and a first contact pad 162 and a second contact pad 164 formed on the active surface 160a. The active surface 160a of the chip 160 is arranged downward and attached to the first metal layer 110 (i.e. the active surface 160a facing the first metal layer 110). Next, the underfill 150 is cured, and the chip 160 is fixed onto the first metal layer 110.

Figure 2:
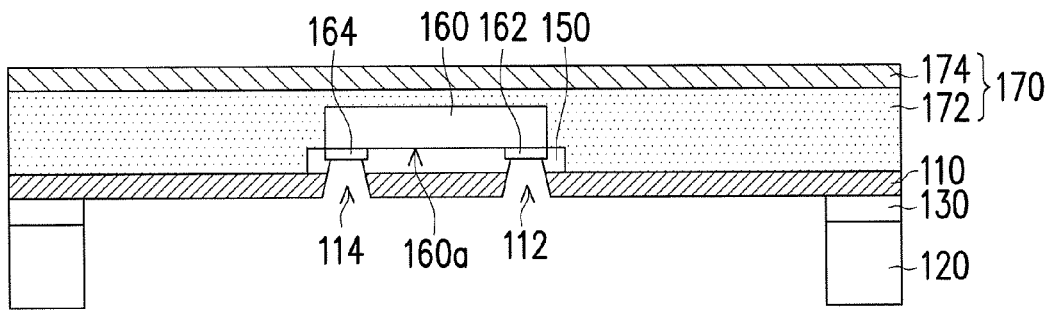

Subsequently, as shown in FIG. 2, a multilayer board 170 is provided and covers over the first metal layer 110 and the chip 160 by press lamination. The multilayer board 170 includes at least a first filling layer 172 and a second metal layer 174 formed on the first filling layer 172. The first filling layer 172 may include a core (plate) and prepregs. Because the prepreg is a semi-cured adhesive sheet impregnated in resins, the chip 160 can be enveloped within the multilayer board 170 by press lamination. The second metal layer 174 may be a resin-coated copper foil (RCC) or a copper foil. The resin-coated copper foil is a copper foil coated with at least one layer of the adhesive resin, and the adhesive resin layer can function as either an insulating layer or an adhesive layer, which can improve the binding between the copper foil and the substrate during press lamination. The material of the first filling layer 172 may include the Ajinomoto build-up film (ABF) or bis-malemide triazine (BT).

Thereafter, following the press lamination, as shown in FIG. 2, the first filling layer 172 of the multilayer board 170 encapsulates the chip 160 and the second metal layer 174 is located above the first filling layer 172 and the chip 160. Then, the carrier plate 120 is partially removed by removing the release layer 140, so that the release layer 140 and the adhesive layer 130 and the carrier plate 120 beneath the release layer 140 are removed and separate from the first metal layer 110. Next, a first borehole 112 and a second borehole 114 are formed in the first metal layer 110 penetrating through the first metal layer 110, and the first borehole 112 exposes the first contact pad 162 and the second borehole 114 exposes the second contact pad 164. The first borehole 112 and the second borehole 114 may be formed by laser drilling, for example.

Figure 3:
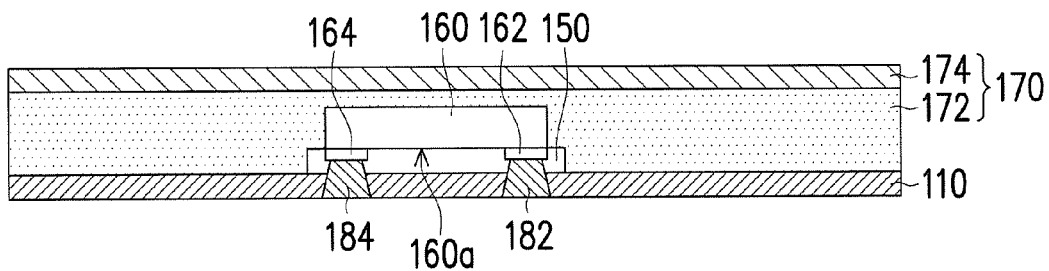

Reference to FIG. 3, the remained adhesive layer 130 and the carrier plate 120 are removed, and a via filling process is performed to fill up the boreholes to respectively form a first metal filled via structure 182 and a second metal filled via structure 184 within the first borehole 112 and the second borehole 114. The via filling process may be a copper electroplating via filling process, and the formed first and second metal filled via structures may be copper filled via structures (copper plugs). In the present embodiment, laser drilling is used to form the first borehole 112 and the second borehole 114, and the via filling process is applied to fill the boreholes to form the first and second metal filled via structures 182, 184 in the first and second boreholes 112, 114. Compared to the cylindrical stud bump used for connecting the chip and the package substrate having a height of approximately 80 μm, the first and second metal filled via structures 182, 184 filled in the boreholes have a smaller height of no more than 40 μm, thereby reducing the overall height of the package structure. Also, by fouling the metal filled via structures, instead of the bumps, the high frequency parasitic effects caused by the bumps may be avoided and the electrical performance can be enhanced.

Figure 4:
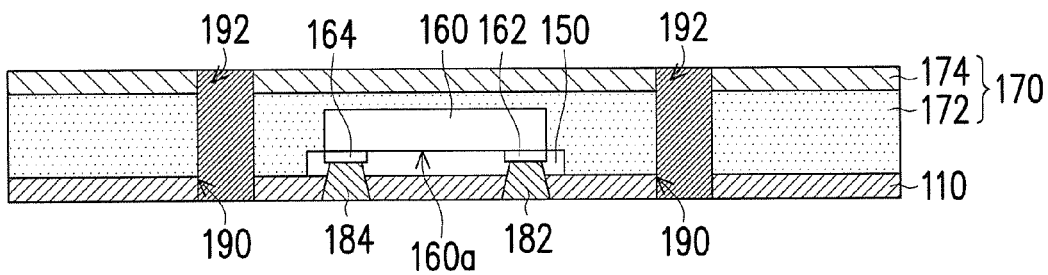

Referring to FIG. 4, at least one through-hole 190 is formed, penetrating through the first metal layer 110 and the multilayer board 170. The through-hole 190 is formed by mechanical drilling, for example. Then, a plated through-hole structure 192 is formed in the through-hole 190 by electroplating, and the plated through-hole structure 192 electrically connects the first metal layer 110 and the second metal layer 174. The plated through-hole structure 192 may be formed by, for example, a copper plating process.

Figure 5:
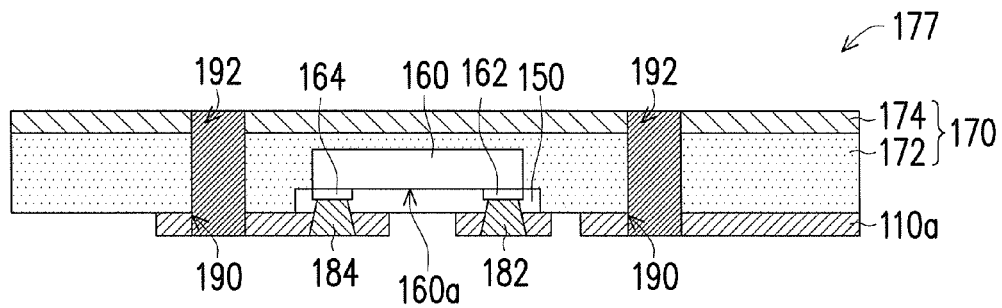

Referring to FIG. 5, the first metal layer 110 is patterned to form a patterned first metal layer 110a. So far, a lamination of the multilayer board 170, the plated through-hole structure 192, the chip 160, the first and second metal filled via structures 182, 184 and the patterned first metal layer 110a can be viewed as the laminated structure 177 embedded with the chip 160.

Figure 6:
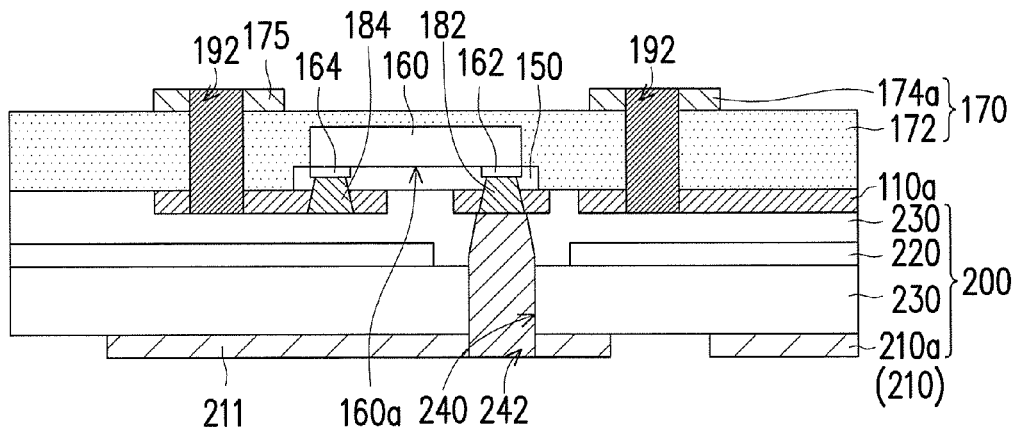

Referring to FIG. 6, a multi-layered substrate 200 is provided and covers over the patterned first metal layer 110a. The multi-layered substrate 200 comprises at least an insulating layer 230 and a third metal layer 210 on the insulating layer 230. The opposite side of the third metal layer 210 of the multi-layered substrate 200 is covered to the patterned first metal layer 110a and then press laminated. The insulating layer 230 may further include at least one wiring layer 220, located between the third metal layer 210 and the patterned first metal layer 110a. The wiring layer 220 can be used as a ground layer. After the press lamination, a through-hole 240 is formed, penetrating through the multi-layered substrate 200 until the surface of the first metal filled via structure 182 is exposed. Subsequently, a plated via structure 242 is formed by electroless plating within the through-hole 240, so that the third metal layer 210 is electrically connected to the first metal filled via structure 182. Next, the second metal layer 174 and the third metal layer 210 are patterned to form a patterned second metal layer 174a and a patterned third metal layer 210a. Referring to FIG. 6, the patterned third metal layer 210a includes an antenna pattern 211 located below the chip 160, and the patterned second metal layer 174a comprises at least a plurality of bonding pads 175. The through-hole 240 may be formed by mechanical drilling and laser drilling, for example, and may be formed by mechanical drilling a blind hole in the multi-layered substrate 200 and then continue drilling the aforementioned blind hole by laser drilling through the entire multi-layered substrate 200. Thus, the through-hole 240 can be formed accurately to stop at the surface of the first metal filled via structure 182. Finally, the solder balls or connectors are bonded to the bonding pads 175 and are electrically connected to the plated through-hole structure 192. The solder balls or the connectors can be further connected to an external printed circuit board. In this embodiment, as the antenna pattern 211 is formed right above the location of the chip 160 and the plated via structure 242 is formed to directly electrically connect the antenna pattern 211 and the chip 160, the signal transmission path is shortened and the high-frequency signal loss caused by wire bonding between the chip 160 and the antenna pattern 211 may be avoided, further lessening the signal loss along the transmission path.

Figure 7A:
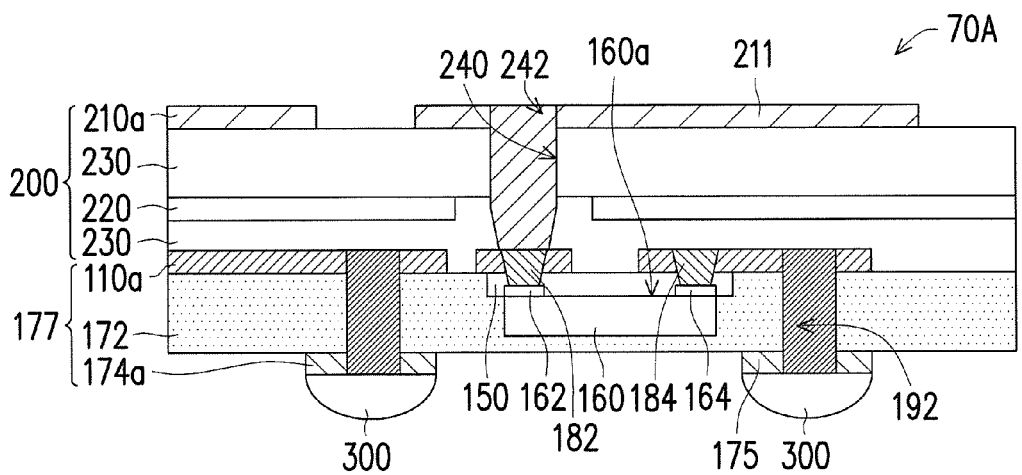
FIGS. 7A and 7B show schematic cross-sectional views of an integrated antenna package in accordance with a first embodiment of the present disclosure.
Figure 7B:
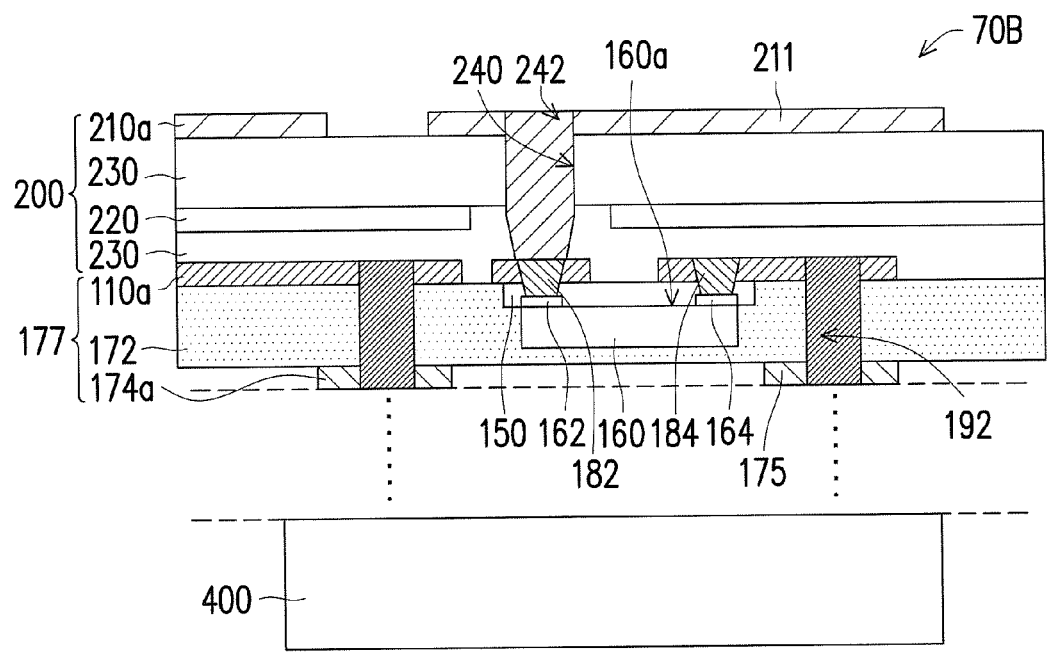

FIGS. 7A and 7B show schematic cross-sectional views of an integrated antenna package in accordance with a first embodiment of the present disclosure.

With reference to FIGS. 7A and 7B, following the above manufacturing method, the integrated antenna packages 70A and 70B are obtained; each integrated antenna package comprises the laminated structure 177 and the multi-layered substrate 200. The laminate structure 177 includes the patterned first metal layer 110a, the patterned second metal layer 174a, a filling layer 172 located between the patterned first and second metal layers and at least one chip 160. The chip 160 is embedded within the filling layer 172, and the chip 160 has an active surface 160a, the first contact pad 162 and the second contact pad 164. The first metal filled via structure 182 and the second metal filled via structure 184 respectively filled within the first and second boreholes of the patterned first metal layer 110a are respectively connected to the first contact pad 162 and the second contact pad 164. The laminated structure 177 includes at least one plated through-hole structure 192, penetrating through the patterned first metal layer 110a, the filling layer 172 and the patterned second metal layer 174a and electrically connected the patterned first metal layer 110a and the patterned second metal layer 174a.

Referring to FIGS. 7A and 7B, the multi-layered substrate 200 is laminated on top of the laminated structure 177 and covers the first metal layer 110a. The multi-layered substrate 200 comprises at least one insulating layer 230 and the patterned third metal layer 210a on the insulating layer 230. The patterned third metal layer 210a is located on one side of the multi-layered substrate 200 away from the first metal layer 110a and includes at least one antenna pattern 211. The antenna pattern 211 is located above the chip 160. Here, whether it is described to be above or beneath in the context, it depends on the placement direction of this package, and the artisan in this field understands that the position of the antenna pattern is mainly aligned with the position of the chip. Basically, the distribution area of the antenna pattern 211 should be equal to or greater than that of the underlying chip, but the positions of these two should coordinate. In addition, the multi-layered substrate 200 includes a through-hole 240, penetrating through the multi-layered substrate 200 and terminating at the first metal layer 110a corresponding to the first metal filled via structure 182. The plated via structure 242 formed in the through-hole 240 electrically connects the antenna pattern 211 and the chip 160. Moreover, the patterned second metal layer 174a may comprise at least a plurality of bonding pads 175. In FIG. 7A, the solder balls 300 provided on the bonding pads 175 are electrically connected to the plated through-hole structure 192, and the solder balls 300 may further be connected to an external printed circuit board.

In another embodiment, with reference to FIG. 7B, the connector 400 may also be provided over the bonding pads 175 and electrically connected to the plated through-hole structure 192. However, between the connector 400 and the package structure 70B, additional connecting structures, such as multi-layer laminated structure or a single layer structure, a redistribution layer or a wiring layer (shown as dotted line), may be provided, and the present embodiment is not limited thereto. Through the additional connecting structures, the connector 400 is not limited to be located directly below the package 70B. The connector 400 may be further connected to an external printed circuit board, or connected to the bonding pad(s) 175.

The multi-layered substrate 200 further includes a wiring layer 220 located within the insulating layer 230 and between the antenna pattern 211 and the patterned first metal layer 110a. The insulting layer (second filling layer) 230 is filled between the antenna pattern 211, the wiring layer 220 and the patterned first metal layer 110a. The wiring layer 220 may function as a ground layer or a redistribution layer. Finally, the solder balls 300 or the connector 400 are disposed on the patterned second metal layer 174a, so that the solder ball 300 or the connector 400 at least connects to one plated through-hole structure 192. The solder balls 300 or the connector 400 may further connect to an external circuit board.

Figure 8:
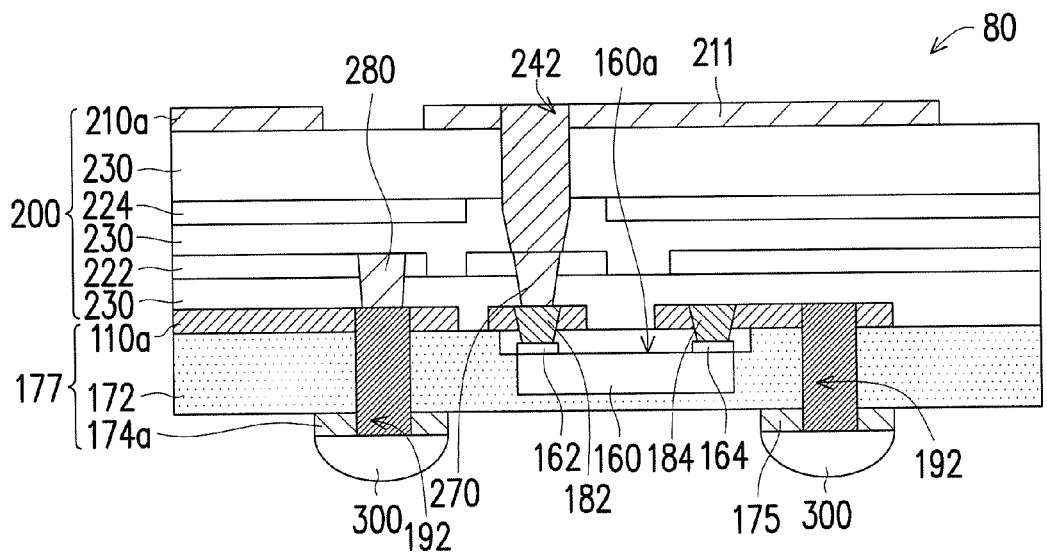
FIG. 8 shows a schematic cross-sectional view of an integrated antenna package in accordance with a second embodiment of the present disclosure.

FIG. 8 shows a schematic cross-sectional view of an integrated antenna package in accordance with a second embodiment of the present disclosure. Similar to the package structure 70A, for the integrated antenna package 80 in this embodiment, as shown in FIG. 8, the multi-layered substrate 200 includes wiring layers 222 and 224, located within the insulating layer 230 and located between the antenna pattern 211 and the patterned first metal layer 110a. One of the two wiring layers 222 & 224 functions as a redistribution layer and the other layer functions as a ground layer. The ground layer (plane) may also function as a shielding layer to protect the chip 160 from excessive electromagnetic interference (EMI), thus lessening the interference to the operation of the integrated antenna package. The scope of the present disclosure is not limited to the relative arrangements of the wire layer and the ground/shielding layer(s) as described in the embodiments, and the redistribution layer may be located above or below the ground/shielding layer(s). The integrated antenna package structure 80 may further include a metal filled via structure 270 connecting the wiring layer 222, and the first metal filled via structure 182, and a metal filled via structure 280 connecting the wiring layer 222 and the plated through-hole structure 192. Through the arrangement of disposing one or more layers of wiring layers, the package structure can integrate more components or the layout design of the wirings or traces may be more flexible.

Figure 9:
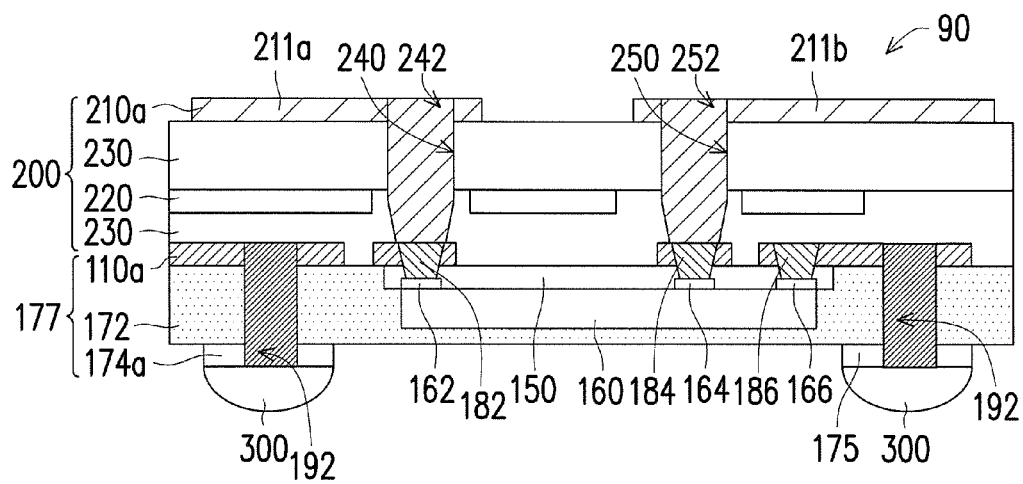
FIG. 9 shows a schematic cross-sectional view of an integrated antenna package in accordance with a third embodiment of the present disclosure.

FIG. 9 shows a schematic cross-sectional view of an integrated antenna package in accordance with a third embodiment of the present disclosure. Similar to the package structure 70A, for the integrated antenna package 90 in this embodiment, as shown in FIG. 9, the chip 160 further includes a third contact pad 166, and a third metal filled via structure 186 filled within a third borehole of the patterned first metal layer 110a is connected with the third contact pad 166. In addition, the multi-layered substrate 200 of the integrated antenna package structure 90 further includes a through-hole 250 penetrating through the multi-layered substrate 200 and terminating at the second metal filled via structure 184 and a plated via structure 252 formed within the through-hole 250. Further, the patterned third metal layer 210a comprises the antenna pattern 211a and the antenna pattern 211b positioned above the chip 160. The plated via structure 242 electrically connects the antenna pattern 211a and the chip 160, while the plated via structure 252 electrically connects the antenna pattern 211b and the chip 160.

Figure 10:
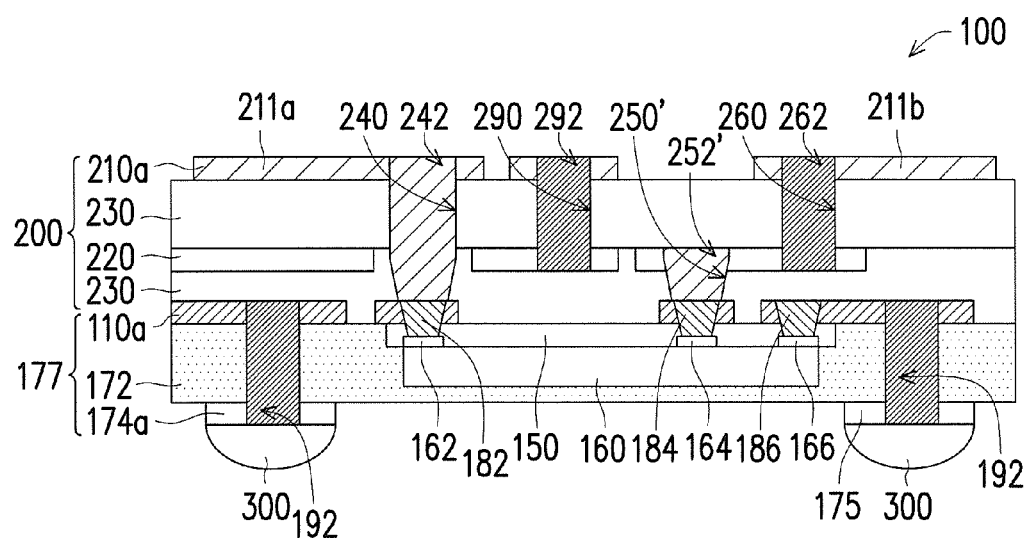
FIG. 10 shows a schematic cross-sectional view of an integrated antenna package in accordance with a fourth embodiment of the present disclosure.

FIG. 10 shows a schematic cross-sectional view of an integrated antenna package in accordance with a fourth embodiment of the present disclosure. Compared to the package structure 90, the integrated antenna package 100 provided in this embodiment 100 has a through-hole 250' penetrating through the wiring layer 220 and the insulating layer 230 of the multi-layered substrate 200 and a plated via structure 252' formed within the through-hole 250' electrically connects the chip 160 and the wiring layer 220. In addition, the multi-layered substrate 200 has a plated through-hole structure 262 penetrating through the patterned third metal layers 210a, the insulating layer 230 and the wiring layer 220, and the plated through-hole structure 262 electrically connects the wiring layer 220 and the antenna pattern 211b. In other words, through the plated via structure 252' and the plated through-hole structure 262, the chip 160 is electrically connected with the antenna pattern 211b. Furthermore, the multi-layered substrate 200 of the package structure 100 further includes a plated through-hole structure 292 penetrating through the patterned third metal layers 210a, the insulating layer 230 and the wiring layer 220, and the plated through-hole structure 292 may offer the functions of grounding and shielding.

In the foregoing embodiments of the present disclosure, although only one or two antenna patterns, only one chip, and/or only two or three contact pads per chip are shown in the drawings, the scope of the present disclosure is not limited thereto, and the integrated antenna package can be configured to have multiple chips or multiple antenna patterns, and the chip may include a plurality of contact pads. In these embodiments, the chip 160 may be a radio frequency (RF) chip, the material of the first, second or third metal layer may include aluminum, copper, nickel, gold or silver, or combinations thereof. The antenna pattern may be a radio frequency antenna pattern, such as a patch antenna. According to the preferred embodiment, the antenna pattern is an antenna operated at the 77 GHz band.

In summary, for the 110 GHz band, compared to the insertion loss of 1.6 dB for the conventional package structure connecting the RF chip to the package substrate using flip-chip bonding and bumps, the insertion loss of the integrated antenna package structure of the present disclosure is lowered to be 1.0 dB by using the metal via-filled structure(s) formed within the borehole(s) of the metal layer for electrically connecting the embedded chip and the metal layer. Accordingly, for the integrated antenna package structure of the present disclosure that incorporates the embedded RF chip without using the bumps for connection, the feed-in insertion loss is at least 37.5% lower.

For the integrated antenna package structure of the present disclosure, the electrical connection structures formed within the borehole(s) and the through-hole(s) are utilized to electrically connect the RF chip(s) with the antenna pattern(s) located at different layers of the laminate structure, which shortens the signal transmission path and reduces the signal transmission loss. In the present disclosure, as the antenna pattern is arranged above or below the chip, the vertical arrangement helps to integrate the chip and the antenna pattern through vertical connection structure(s) so as to shorten the transmission distance between the antenna pattern(s) and the chip(s), thereby reducing the power loss and improving the performance of the package or the module for millimeter wave applications.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:

1. A manufacturing method of an integrated antenna package, comprising:
   providing a first metal layer;
   disposing a chip on the first metal layer, wherein the chip includes a first contact pad and a second contact pad, wherein the first contact pad and the second contact pad faces the first metal layer, and the first contact pad and the second contact pad are electrically connected with the first metal layer;
   press laminating a multilayer board over the first metal layer and the chip, wherein the multilayer board comprises a filling layer and a second metal layer, and the second metal layer is disposed on the filling layer and electrically connected to the first metal layer and the chip is embedded within the filling layer;
   patterning the first metal layer;
   covering a multi-layered substrate to the patterned first metal layer, wherein one side of the multi-layered substrate away from the first patterned metal layer has a third metal layer;
   forming a through-hole penetrating the multi-layered substrate and terminating at the patterned first metal layer electrically connected to the first contact pad;
   forming a plated via structure in the through-hole and the plated via structure connects the third metal layer and the first contact pad; and
   patterning the second metal layer and the third metal layer to form a patterned second metal layer and a patterned third metal layer, wherein the patterned third metal layer includes an antenna pattern located beneath the chip, and the antenna pattern is electrically coupled to the chip through the plated via structure.

2. The manufacturing method of the integrated antenna package of claim 1, further comprising forming a first borehole and a second borehole penetrating through the first metal layer, wherein the first borehole exposes the first contact pad and the second borehole exposes the second contact pad, and a first metal filled via structure and a second metal filled via structure are respectively formed in the first borehole and the second borehole, so that the chip is electrically connected with the first metal layer.

3. The manufacturing method of the integrated antenna package of claim 2, wherein the multi-layered substrate covers the first metal filled via structure and the second metal filled via structure, and the through-hole terminates at a surface of the first metal filled via structure.

4. The manufacturing method of the integrated antenna package of claim 2, wherein forming the first borehole and the second borehole comprises forming the first borehole and the second borehole by laser drilling.

5. The manufacturing method of the integrated antenna package of claim 1, further comprising forming at least one plated through-hole structure penetrating through the first metal layer and the multilayer board, wherein the at least one plated through-hole structure electrically connects the first metal layer and the second metal layer.

6. The manufacturing method of the integrated antenna package of claim 5, wherein forming the at least one plated through-hole structure comprises forming at least one through-hole penetrating through the first metal layer and the multilayer board by mechanical drilling and forming the at least one plated through-hole structure by electroplating.

7. The manufacturing method of the integrated antenna package of claim 1, wherein the multi-layered substrate further comprises an insulating layer and a wiring layer, the insulating layer is located between the antenna pattern and the first metal layer, and the wiring layer is located in the insulating layer.

8. The manufacturing method of the integrated antenna package of claim 1, wherein the chip is a radio frequency chip and disposing the chip on the first metal layer further comprises forming an underfill on the first metal layer, and then adhering the chip onto the underfill and curing the underfill so that the chip is fixed onto the first metal layer.

9. The manufacturing method of the integrated antenna package of claim 1, wherein the second metal layer is a resin coated copper foil or a copper foil.

10. The manufacturing method of the integrated antenna package of claim 1, wherein forming the through-hole comprises forming the through-hole by mechanical drilling and laser drilling.

11. An integrated antenna package structure, comprising:
   a laminated structure, wherein the laminated structure comprises a first metal layer, a second metal layer, a filling layer between the first metal layer and the second metal layer and at least one chip, wherein the at least one chip is embedded within the filling layer, and the chip has a first contact pad and a second contact pad, and the first metal layer and the first and second contact pads and the second metal layer are electrically connected; and a multi-layered substrate, wherein the multi-layered substrate is stacked on the laminated structure and cover over the first metal layer, the multi-layered substrate at least includes an insulating layer and a third metal layer, the third metal layer is located on one side of the multi-layered substrate away from the laminated structure and the third metal layer includes at least an antenna pattern located below the chip, wherein the multi-layered substrate includes at least a plated via structure penetrating through the multi-layered substrate and connected with the first contact pad, so as to electrically connect the antenna pattern with the chip.

12. The integrated antenna package structure of claim 11, wherein the first metal layer includes a first borehole and a second borehole respectively exposing the first contact pad and the second contact pad, and a first metal filled via structure and a second metal filled via structure filled respectively in the first borehole and the second borehole for electrically connecting the first metal layer and the chip.

13. The integrated antenna package structure of claim 12, wherein the first and second metal filled via structures are copper filled via structures.

14. The integrated antenna package structure of claim 11, wherein the laminated structure further comprises at least one plated through-hole structure, penetrating through the first metal layer, the filling layer and the second metal layer and electrically connecting the first metal layer and the second metal layer.

15. The integrated antenna package structure of claim 11, wherein the multi-layered substrate further comprises a wiring layer, located in the insulating layer and between the first metal layer and the antenna pattern and the wiring layer functions as a ground layer.

16. The integrated antenna package structure of claim 11, wherein the multi-layered substrate further includes a first wiring layer and a second wiring layer, located in the insulating layer and between the first metal layer and the antenna pattern, and the first wiring layer is a redistribution layer, and the second wiring layer functions as a ground layer.

17. The integrated antenna package structure of claim 11, wherein the chip is a RF chip.

18. The integrated antenna package structure of claim 11, wherein the second metal layer is a resin coated copper foil or a copper foil.

19. The integrated antenna package structure of claim 11, wherein the plated via structure is a copper plated via structure.

* * * * *